United States Patent
Lee et al.

(10) Patent No.: US 8,688,063 B2
(45) Date of Patent: Apr. 1, 2014

(54) SIGNAL CONVERTING APPARATUS AND RECEIVING APPARATUS FOR SUPPORTING CONCURRENT DUAL BANDS IN WIRELESS COMMUNICATION SYSTEM

(75) Inventors: Sang-Gug Lee, Daejeon-si (KR); Yuna Shim, Daejeon-si (KR)

(73) Assignee: KAIST (Korea Advanced Institute of Science and Technology), Daejeon-si (KR)

( * ) Notice: Subject to any disclaimer, the term of this patent is extended or adjusted under 35 U.S.C. 154(b) by 39 days.

(21) Appl. No.: 13/423,685

(22) Filed: Mar. 19, 2012

(65) Prior Publication Data
US 2013/0244606 A1    Sep. 19, 2013

(51) Int. Cl.
*H04B 1/18*    (2006.01)

(52) U.S. Cl.
USPC .................................... 455/168.1; 455/188.1

(58) Field of Classification Search
USPC .......... 455/188.1, 168.1, 176.1, 180.1, 552.1, 455/194.2, 334, 341, 278.1, 296
See application file for complete search history.

(56) References Cited

U.S. PATENT DOCUMENTS

| | | | |
|---|---|---|---|
| 6,714,099 B2 | 3/2004 | Hikita et al. | |
| 7,622,989 B2 | 11/2009 | Tzeng et al. | |
| 8,064,867 B2 | 11/2011 | Li et al. | |
| 8,497,945 B2 * | 7/2013 | Lan et al. | 348/731 |
| 8,521,221 B2 * | 8/2013 | Lu et al. | 455/552.1 |
| 2004/0180633 A1 | 9/2004 | Nakatani et al. | |
| 2012/0314810 A1 * | 12/2012 | Chan et al. | 375/302 |

FOREIGN PATENT DOCUMENTS

| | | |
|---|---|---|
| JP | 2002-359542 | 12/2002 |
| KR | 1020040054509 | 6/2004 |

* cited by examiner

*Primary Examiner* — Sonny Trinh
(74) *Attorney, Agent, or Firm* — IP & T Group LLP

(57) ABSTRACT

A receiving apparatus in a wireless communication system includes: an antenna configured to receive a wireless frequency signal including a first frequency band signal and a second frequency band signal; a low noise amplifier (LNA) configured to amplify the wireless frequency signal, output the first frequency band signal as a differential phase signal, and output the second frequency band signal as a common phase signal; a differentiator configured to pass only the differential phase signal between the signals outputted from the LNA; and a combiner configured to pass only the common phase signal between the signals outputted from the LNA.

10 Claims, 8 Drawing Sheets

| FREQUENCY [GHz] | PHASE DIFFERENCE BETWEEN OUTPUTS [degree] | FREQUENCY [GHz] | PHASE DIFFERENCE BETWEEN OUTPUTS [degree] |
|---|---|---|---|
| 4.008 | -180.6 | 9.585 | -5.578 |
| 4.508 | -180.9 | 10.01 | -2.933 |
| 5.008 | -180.1 | 10.05 | -0.7929 |
| 5.487 | -177.4 | 11 | 0.6475 |

SIGNAL CONVERTING APPARATUS AND RECEIVING APPARATUS FOR SUPPORTING CONCURRENT DUAL BANDS IN WIRELESS COMMUNICATION SYSTEM

BACKGROUND OF THE INVENTION

The present invention relates to a signal converting apparatus and a receiving apparatus for supporting concurrent dual bands in a wireless communication system.

Currently, the wireless communication employs technology to increase a data rate using a wideband or multiband, and the research has been actively conducted on a radio frequency (RF) receiver supporting the technology. Such an RF receiver may increase the flexibility of chips to thereby reduce the unit cost. However, the RF receiver has a disadvantage in that the quality of the wireless communication decreases due to the interference between frequency bands corresponding to wireless communication application fields. In order to support wireless communication at a high data rate while minimizing the interference, the power consumption and chip size of the receiver should be increased. In this case, the competitiveness of the receiver may be reduced.

An ultra-wide band intellectual RF receiver capable of processing a wide frequency band of several GHz may obtain an effect of implementing various systems at a low cost. However, since the power consumption of the receiver is high and several frequency bands are amplified by the same gain and then applied to a system, the interference between signals inevitably increases. Meanwhile, a multiband intellectual RF receiver capable of realizing a narrow-band characteristic in two or more frequency bands deals with only a requested frequency band. Therefore, the power consumption of the receiver is low. Even at this time, however, an interference problem still exists. In this case, when a plurality of RF receivers dealing with the respective frequency bands are used, the interference may be minimized. However, the chip size and power consumption thereof are increased, which makes it impossible to maximize the price competitiveness.

SUMMARY OF THE INVENTION

An embodiment of the present invention is directed to an RF receiver capable of minimizing a chip size and power consumption while minimizing interference between frequency bands in a dual-band system.

In accordance with an embodiment of the present invention, a receiving apparatus in a wireless communication system includes: an antenna configured to receive a wireless frequency signal including a first frequency band signal and a second frequency band signal; a low noise amplifier (LNA) configured to amplify the wireless frequency signal, output the first frequency band signal as a differential phase signal, and output the second frequency band signal as a common phase signal; a differentiator configured to pass only the differential phase signal between the signals outputted from the LNA; and a combiner configured to pass only the common phase signal between the signals outputted from the LNA.

In accordance with another embodiment of the present invention, there is provided a load circuit of an LNA, including a first capacitor, a second capacitor, a third capacitor, a first inductor, and a second inductor. The third capacitor is coupled between a first node and a second node, one ends of the first inductor and the first capacitor are coupled between the first node and the third capacitor, the second inductor and the second capacitor are coupled between the second node and the third capacitor, and the other ends of the first inductor, the first capacitor, the second inductor, and the second capacitor are coupled to a ground terminal.

In accordance with another embodiment of the present invention, an LNA includes an input terminal and a first intermediate tap inductor including: an impedance matching unit configured to match a single-phase signal inputted through the input terminal; first and second inductors coupled to the impedance matching unit and having one ends coupled symmetrically through a first tap; and a first second parasitic capacitor and a second capacitor being symmetrical with the first tap, wherein the first intermediate tap inductor configured to convert the single-phase signal outputted from the impedance matching unit into a differential phase signal and a common phase signal.

DESCRIPTION OF SPECIFIC EMBODIMENTS

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the entire specification and claims, when a certain unit "includes/comprises" a certain component, it means that the unit may further include/comprise another component without excluding another component, as long as specific descriptions are not made.

Now, a signal converting apparatus and a receiving apparatus in a wireless communication system according to an embodiment of the present invention will be described in detail with reference to the accompanying drawings.

Figure 1:
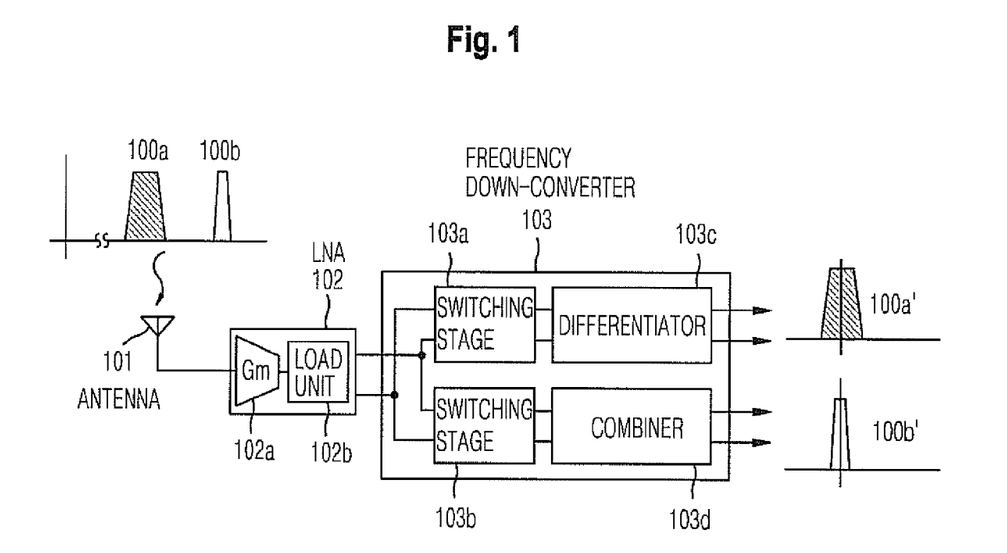
FIG. 1 is a diagram illustrating a receiving apparatus in a wireless communication system according to the embodiment of the present invention.

FIG. 1 is a diagram illustrating the receiving apparatus in a wireless communication system according to the embodiment of the present invention.

Referring to FIG. 1, the receiving apparatus in a wireless communication system according to the embodiment of the present invention includes an antenna 100, a low noise amplifier (LAN) 102, and a frequency down converter 103.

The antenna 100 is configured to directly receive an RF signal from a transmitting apparatus in a wireless communication system.

The LNA 102 includes a transconductance (Gm) unit 102a configured to convert an input voltage into a current and a load unit 102b configured to convert the current into a voltage. The LNA 102 amplifies a selected signal while minimizing noise. The LNA 102 converts the amplified signal into a differential phase signal and a common phase signal at the same time for each frequency band. Accordingly, in this specification, the LNA 102 may be used together with a signal converting apparatus.

The frequency down converter 103 includes a first frequency down-conversion switching stage 103a, a second frequency down-conversion switching stage 103b, a differentiator 103c, and a combiner 103d.

The first frequency down-conversion switching stage 103a is configured to down-convert a differential signal of a first frequency band into a local oscillator frequency corresponding to the first frequency band. At this time, a signal of a second frequency band is also down-converted into a common mode signal.

The differentiator 103c is configured to pass only a differential signal of the first frequency band and offset the command mode signal of the second frequency band, between the down-converted dual-band signals.

The second frequency down-converting switching stage 103b is configured to down-convert the common mode signal of the second frequency band into a local oscillator frequency corresponding to the second frequency band. At this time, a signal of the first frequency band is also down-converted.

The combiner 103d is configured to pass only the common mode signal of the second frequency band and offset the differential signal of the first frequency, between the down-converted dual-band signals.

Here, the positions of the frequency down-conversion switching stages, the differentiator, and the combiner may be changed. Even at this time, a small area may be implemented at low power as in the above-described configuration. FIG. 1 illustrates that the differentiator 103c and the combiner 103d are provided separately from the frequency down-conversion switching stages 103a and 103b. However, the differentiator 103c and the combiner 103d may be implemented in a transconductance form of the frequency down converter 103.

Referring to FIGS. 2 to 12, a signal converting apparatus in a wire communication system according to the embodiment of the present invention will be described in detail.

Figure 2:
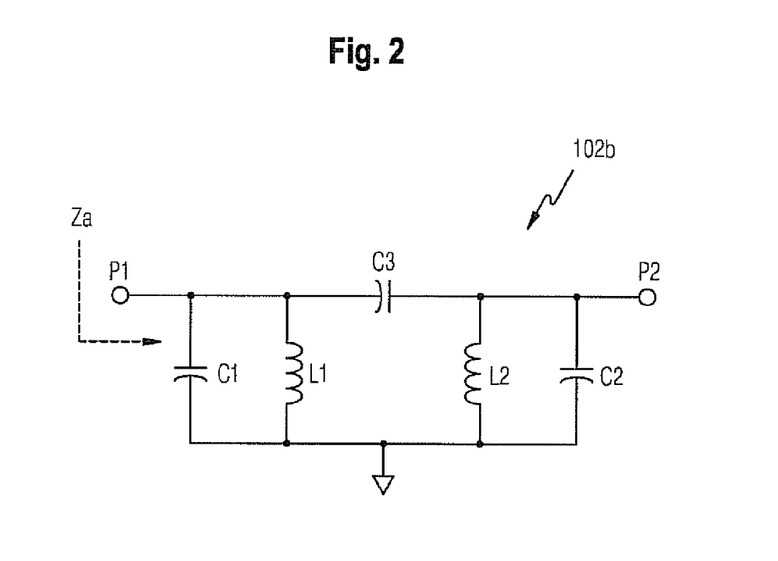
FIG. 2 is a circuit diagram illustrating a load unit of a signal converting apparatus according to a first embodiment of the present invention.

FIG. 2 illustrates a load unit 102b of a signal converting apparatus according to a first embodiment of the present invention.

Referring to FIG. 2, the load unit 102b of the signal converting apparatus includes capacitors C1 to C3 and inductors L1 and L2. For convenience of description, it is assumed that the capacitors C1 to C3 and the inductors L1 and L2 are ideal passive elements.

The capacitor C3 is coupled between a node P1 and a node P2, one ends of the capacitor C1 and the inductor L1 are coupled between the node P1 and the capacitor C3, and one ends of the capacitor C2 and the inductor L2 are coupled between the node P2 and the capacitor C3. Furthermore, the other ends of the capacitors C1 and C2 and the inductors L1 and L2 are coupled to a ground terminal.

A high impedance value is applied to the nodes P1 and P2, and this state is similar to an open state. Furthermore, the relations of $C=C_1=C_2$ and $L=L_1=L_2$ may be established. Therefore, impedance Za at the node P1 may be expressed as Equation 1 below.

$$Za = j\omega L \frac{[1 - \omega^2 L(C_3 + C)]}{(1 - \omega^2 LC)[1 - \omega^2 L(2C_3 + C)]} \quad \text{[Equation 1]}$$

Here, $\omega$ represents an angular frequency ($2\pi f$), C represents capacitance, and L represents inductance. Through Equation 1, it can be seen that the circuit of FIG. 2 has two parallel resonant frequencies and one serial resonant frequency. The inductance values L for deciding the resonant frequencies are all constant, and the capacitance values C and $C_3$ are different for the respective frequencies. The respective frequencies may be expressed as Equations 2 to 4 below.

$$\omega_{low} = \frac{1}{\sqrt{L(2C_3 + C)}} \quad \text{[Equation 2]}$$

$$\omega_{mid} = \frac{1}{\sqrt{L(C_3 + C)}} \quad \text{[Equation 3]}$$

$$\omega_{high} = \frac{1}{\sqrt{LC}} \quad \text{[Equation 4]}$$

Here, C represents capacitance, and L represents inductance. As shown in Equations 2 and 4, parallel resonance occurs in the low frequency band $\omega_{low}$ and the high frequency band $\omega_{high}$, and the impedance Za becomes infinite. Meanwhile, as shown in Equation 3, serial resonance occurs in the middle frequency band $\omega_{mid}$, and the impedance Za becomes zero.

Meanwhile, when an arbitrary input signal Vs is inputted to the node P1, a transfer function for checking a signal $V_{P1}$ at the node P1 may be expressed as Equation 5 below.

$$\frac{V_{P1}}{V_s} = \frac{j\frac{\omega L}{R_s}[1 - \omega^2 L(C_3 + C)]}{(1 - \omega^2 LC)[1 - \omega^2 L(2C_3 + C)] + j\frac{\omega L}{R_s}[1 - \omega^2 L(C_3 + C)]} \quad \text{[Equation 5]}$$

Here, $\omega$ represents an angular frequency ($2\pi f$), C represents capacitance, L represents inductance, and Rs represents resistance of an arbitrary input signal Vs. Since the circuit of FIG. 2 is a circuit serving as the load unit 102b of the LAN 102 in FIG. 1, the resistance Rs may be set to a very large value. The value of the transfer function of Equation 5 becomes 1 at the low frequency of Equation 2 and the high frequency of Equation 4, and the value of the transfer function of Equation 5 becomes 1 at the middle frequency of Equation 3.

Similarly, when an arbitrary input signal Vs is applied to the node P2, a transfer function for checking a signal $V_{P2}$ at the node P2 may be expressed as Equation 6 below.

$$\frac{V_{P2}}{V_s} = \frac{j\frac{\omega^3 L^2 C_3}{R_s}}{(1-\omega^2 LC)[1-\omega^2 L(2C_3+C)] + j\frac{\omega L}{R_s}[1-\omega^2 L(C_3+C)]} \quad \text{[Equation 6]}$$

Here, ω represents an angular frequency (2πf), C represents capacitance, L represents inductance, and Rs represents resistance of an arbitrary input signal Vs. The denominator of Equation 6 is equal to that of Equation 5. This means that the transfer functions of the nodes P1 and P2 are equal to each other in the case of parallel resonance, but different from each other in the case of serial resonance.

Figure 3:
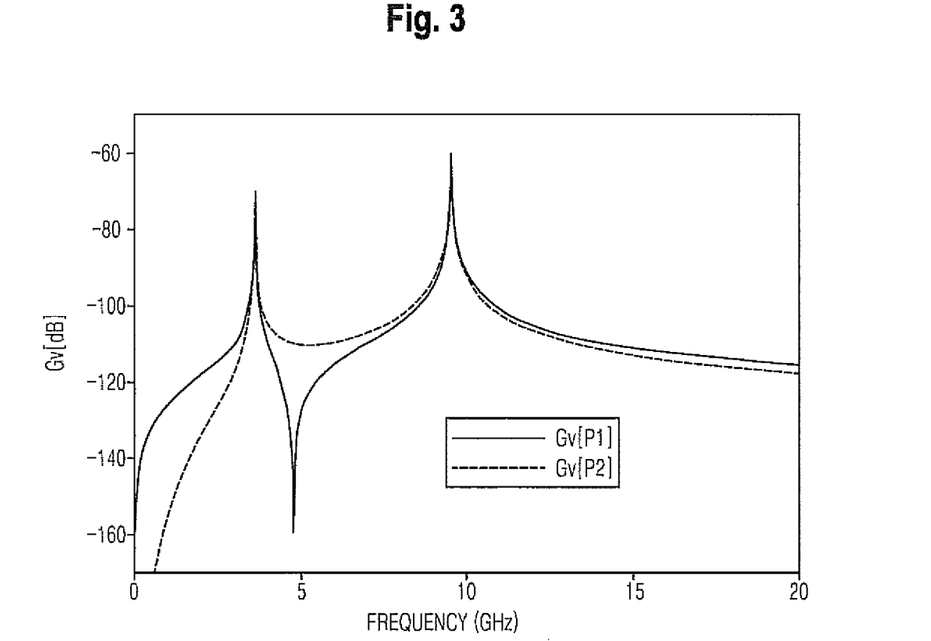
FIG. 3 is a graph showing a simulation result for transfer function values at nodes P1 and P2 in the circuit diagram of FIG. 2.

FIG. 3 is a graph showing a simulation result for the transfer function values at the nodes P1 and P2 in the circuit diagram of FIG. 2.

In FIG. 3, a solid line indicates the transfer function of Equation 5, i.e., the transfer function at the node P1 which is represented by the unit of dB, and a dotted line indicates the transfer function of Equation 6, i.e., the transfer function at the node 92 which is represented by the unit of dB. Referring to FIG. 3, it can be seen that the transfer functions of Equations 5 and 6 have the same value in the case of the parallel resonance occurring at the low frequency and the high frequency, and have different values in the case of the serial resonance occurring at the middle frequency.

As the simulation result, the reason that the transfer function values do not become 1 (0 in the unit of dB) at the low frequency and the high frequency is that the resistance Rs is set to a very large value. When the resolution of the simulation is significantly increased, the transfer function values may become 1. For the same reason, the transfer function value at the middle frequency does not become 0 (negative infinity in the unit of dB).

Figure 4:
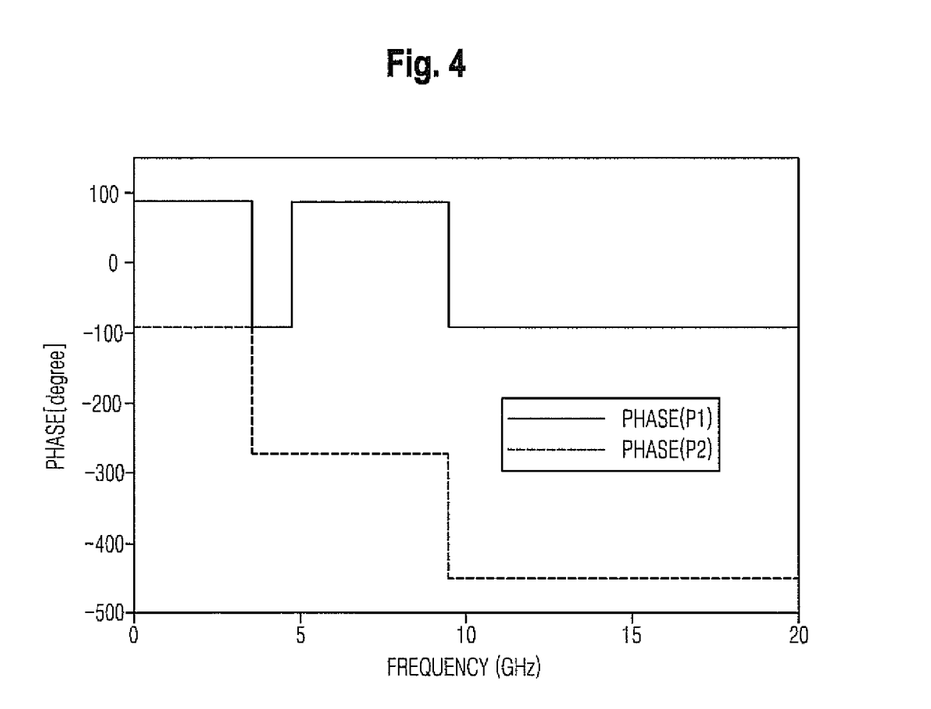
FIG. 4 is a graph showing phases at the nodes P1 and P2 in the circuit diagram of FIG. 2.

FIG. 4 is a graph showing phases at the nodes P1 and P2 in the circuit diagram of FIG. 2.

Referring to FIG. 4, a solid line indicates a phase characteristic at the node P1, and a dotted line indicates a phase characteristic at the node P2. According to the unique characteristics of an LC resonant circuit, the phase changes by −180 degrees in the case of the parallel resonance, and the phase changes by 180 degrees in the case of the serial resonance. The phase characteristic at the node P1 is that the phase changes from +90 degrees to −90 degrees at the low frequency of Equation 2 due to the parallel resonance, and then changes from −90 degrees to +90 degrees at the middle frequency of Equation 3 due to the serial resonance. Similarly, the phase changes from −90 degrees to +90 degrees at the high frequency of Equation 4 due to the parallel resonance. On the other hand, since the phase characteristic at the node P2 does not include serial resonance, the phase characteristic at the node P2 is that the phase changes by −180 degrees at the low frequency of Equation 2 and the high frequency of Equation 4, respectively, and finally becomes −450 degrees.

Figure 5:
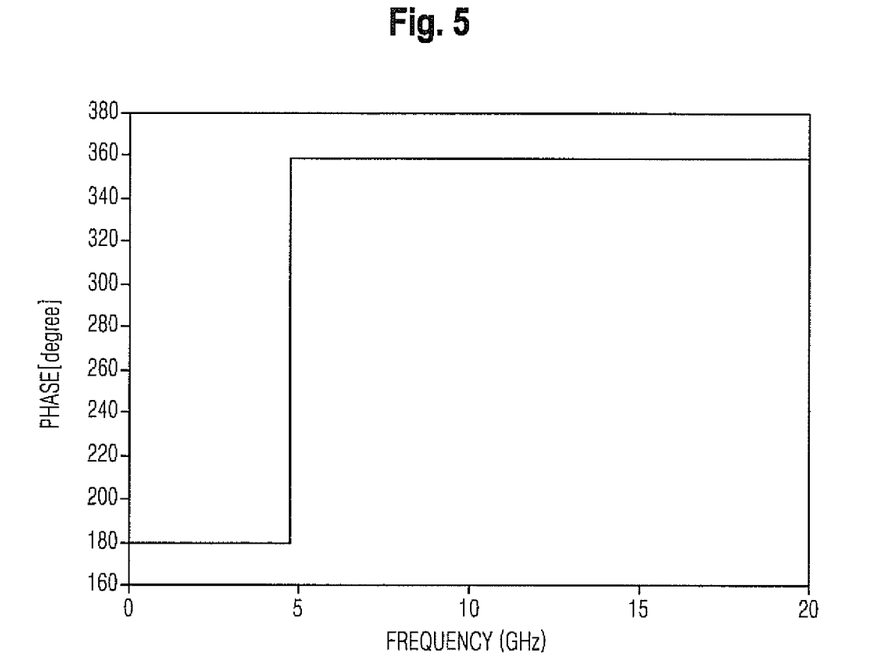
FIG. 5 is a graph showing a phase difference between the node P1 and the node P2 in the circuit diagram of FIG. 2.

FIG. 5 is a graph showing a phase difference between the node P1 and the node P2 in the circuit diagram of FIG. 2.

Referring to FIG. 5, since the serial resonance occurs only at the node P1 and does not occur at the node P2, the phase changes by +180 degrees only at the node P1. Therefore, a phase difference between the node P1 and the node P2 corresponds to 180 degrees in a band before the middle frequency of Equation 3, and 360 degrees in a band after the middle frequency of Equation 4. That is, a signal having a differential phase characteristic of 180 degrees between the nodes at the low frequency of Equation 2, and having a common phase characteristic of 360 degrees between the nodes at the high frequency of Equation 4 is generated.

As such, when the circuit of FIG. 2 is used as the load unit 102b of the LNA 102 in FIG. 1, it is possible to provide a high gain in the respective frequency bands while removing the interference between the frequency bands in the dual-band wireless communication system.

Figure 6:
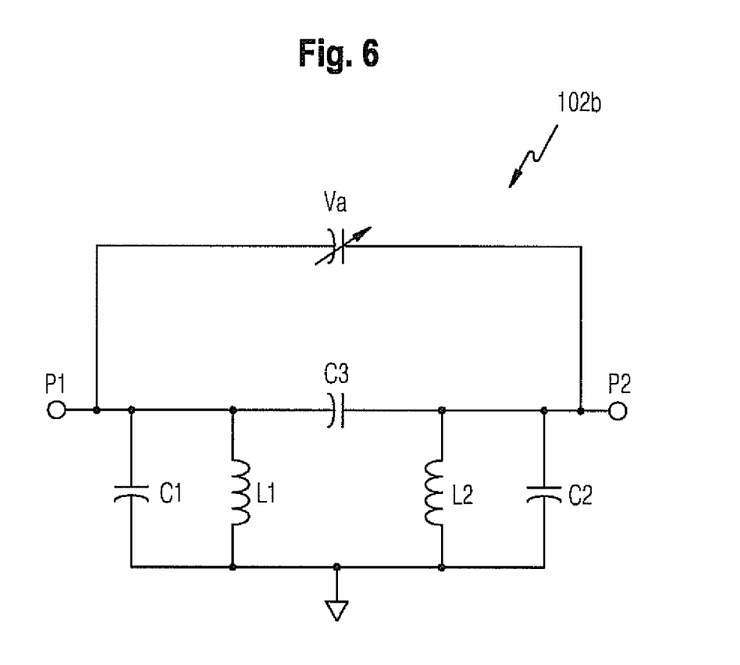
FIG. 6 is a circuit diagram illustrating a load unit of a signal converting apparatus according to a second embodiment of the present invention.

FIG. 6 is a diagram illustrating the load unit 102b of the signal converting apparatus according to a second embodiment of the present invention.

Referring to FIG. 6, a varactor Va serving as a variable capacitor is coupled in parallel to the capacitor C3 in the circuit diagram of FIG. 2. The addition of the varactor Va has an effect upon on the low frequency of Equation 2 and the middle frequency of Equation 3, but does not have an effect upon the high frequency of Equation 4. That is, the varactor Va may change the parallel resonance of Equation 2 so as to adjust a gain characteristic of the low frequency band between the dual bands to a desired frequency, and may change the serial resonance of Equation 3 so as to change a frequency which becomes the boundary between the frequency bands indicating a differential phase difference and a common phase difference. Therefore, the phase difference between the low frequency of Equation 2 and the high frequency of Equation 4 is always maintained at a differential phase and a common phase.

Figure 7:
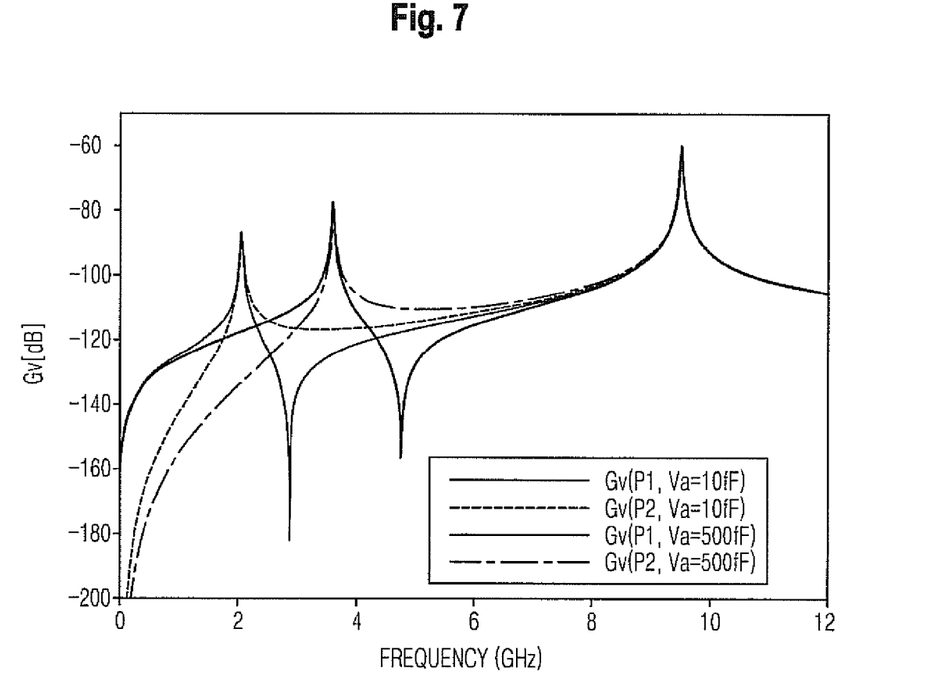
FIG. 7 is a graph showing a simulation result for transfer function values at the nodes P1 and P2 in the circuit diagram of FIG. 6.

FIG. 7 is a graph showing a simulation result for transfer function values at the node P1 and the node P2 in the circuit diagram of FIG. 6.

Referring to FIG. 7, the simulation was performed on the node P1 and the node P2, when the varactor Va has a value of 10 fF and when the varactor Va has a value of 500 fF, respectively. As shown in FIG. 7, both when the varactor Va has a value of 10 fF and when the varactor Va has a value of 500 fF, the transfer function at the node P1 and the transfer function at the node P2 have the same value at the high frequency. On the other hand, the transfer function at the node P1 and the transfer function at the node P2 have different values at the low frequency and at the middle frequency of the serial resonance.

Figure 8:
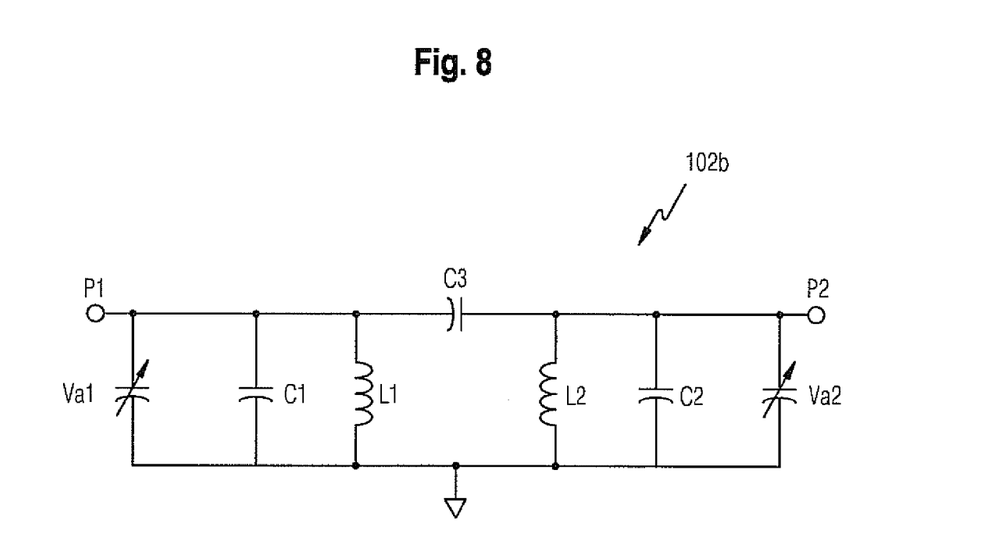
FIG. 8 is a diagram illustrating a load unit of a signal converting apparatus according to a third embodiment of the present invention.

FIG. 8 is a diagram illustrating the load unit 102b of the signal converting apparatus according to a third embodiment of the present invention.

Referring to FIG. 8, a varactor Va1 is coupled in parallel to the capacitor C1 and a varactor Va2 is coupled in parallel to the capacitor C2 in the circuit of FIG. 2. The addition of the varactors Va1 and Va2 has an effect upon the low frequency of Equation 2, the middle frequency of Equation 3, and the high frequency of Equation 4. That is, the circuit diagram of FIG. 8 may control gains in both the low frequency band and the high frequency band of the dual bands, and the frequency becoming the boundary between phase differences also changes. Therefore, the condition for removing interference is maintained at all times.

Figure 9:
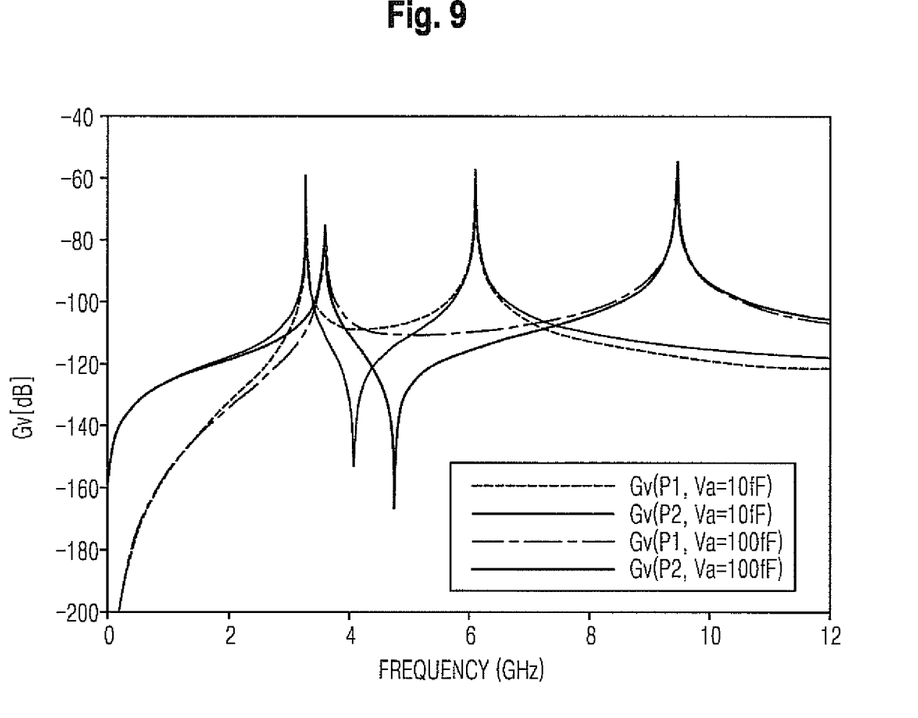
FIG. 9 is a graph showing a simulation result for transfer function values at the nodes P1 and P2 in the circuit diagram of FIG. 8.

FIG. 9 is a graph showing a simulation result for transfer function values at the node P1 and the node P2 in the circuit diagram of FIG. 8.

Referring to FIG. 9, the simulation was performed on the node P1 and the node P2, when the varactor Va1 has a value of 10 fF and when the varactor Va1 has a value of 100 fF, respectively. As shown in FIG. 9, both when the varactor Va1 has a value of 10 fF and when the varactor Va1 has a value of 100 fF, the transfer function at the node P1 and the transfer function at the node P2 have the same value at the low frequency, the middle frequency, and the high frequency.

Figure 10:
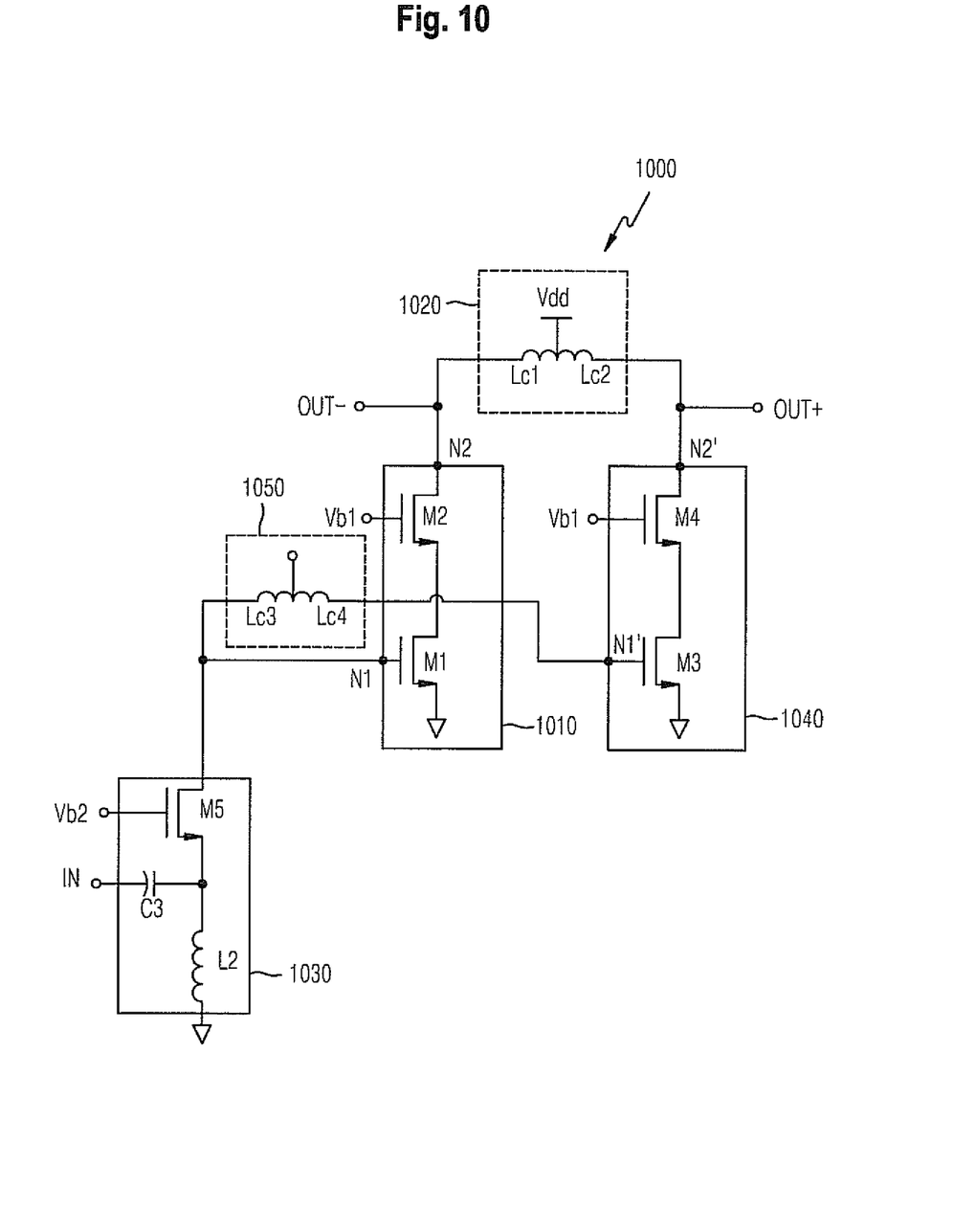
FIG. 10 is a circuit diagram illustrating an example in which the circuit diagram of FIG. 2 is applied to the design of a two-stage LNA.

FIG. 10 illustrates an example in which the circuit diagram of FIG. 2 is applied to the design of a two-stage LNA.

Referring to FIG. 10, the LNA 1000 includes intermediate tap inductors 1020 and 1050, cascode amplifiers 1010 and 1040, and an impedance matching unit 1030.

The impedance matching unit 1030 includes a capacitor C3, an inductor L2, and a transistor M5.

The capacitor C3 is coupled between an input terminal IN and a source of the transistor M5, and the inductor L2 is coupled between the source of the transistor M5 and a ground terminal. A drain of the transistor M5 is coupled to a gate of a transistor M1 of the cascode amplifier 1010, and a gate of the transistor M5 is coupled to a power supply terminal for supplying a bias voltage Vb2.

The transistor M5 is a transistor having a common gate structure, and may include an amplification element having a control terminal, an input terminal, and an output terminal. FIG. 10 illustrates that the transistor M5 is an n-channel field effect transistor (FET).

The capacitor C3 is configured to block a DC voltage at a single-phase signal VRF inputted to the input terminal IN, and the inductor L2 is configured to block an AC voltage at the single-phase signal VRF.

The single-phase signal VRF is inputted to the source of the transistor M5, and then outputted to the gate of the transistor M1 through the drain of the transistor M5. That is, the single-phase signal VRF may be inputted to the gate of the transistor M1 by the transistor M5, without reflection. At this time, a direct current flowing to the source of the transistor M5 and the size of the transistor M5 may be adjusted to constantly maintain the input impedance of the transistor M1 at all times, regardless of the frequency bands.

Meanwhile, the intermediate tap inductors 1020 and 1050 may be modeled in a similar manner to the circuit diagram of FIG. 2. The intermediate tap inductors 1020 and 1050 include inductors Lc1 and Lc2 coupled symmetrically and inductors Lc3 and Lc4 coupled symmetrically, and parasitic capacitors between the intermediate tap inductors and the substrate symmetrically exist. The intermediate tap inductors and the parasitic capacitors may be modeled into the inductors L1 and L2 and the capacitors C1 and C2 in the circuit diagram of FIG. 2.

Furthermore, the capacitor C3 in the circuit diagram of FIG. 2 basically exists due to such a characteristic that the lines of the intermediate tap inductors are positioned physically close to each other. Therefore, the load unit of each stage in the two-stage LNA according to the embodiment of the present invention serves to simultaneously reduce noise for signals of the dual-band wireless communication system, provide a gain, and remove interference between the respective bands.

The wideband single-phase signal VRF outputted to the drain of the transistor M5 is converted into a differential phase signal and a common phase signal by the intermediate tap inductor 1050.

One ends of the respective inductors Lc3 and Lc4 of the intermediate tap inductor 1050 are shared through a tap and then AC-grounded. That is, the one ends of the respective inductors Lc3 and Lc4 may be coupled to a power supply terminal Vdd or ground terminal, or coupled to a power supply terminal for supplying a specific bias voltage. Here, the one ends of the respective inductors Lc3 and Lc4 should be coupled to a specific bias voltage for biasing the M1 and M3 transistors.

The other end of the inductor Lc3 is coupled to the input terminal N1 of the cascode amplifier 1010 and the drain of the transistor M5, and the other end of the inductor Lc4 is coupled to an input terminal N1' of the cascode amplifier 1040. The inductor Lc3 serves as a load of the transistor M5 and causes resonances at two different frequencies.

At this time, the first resonance is caused by the parasitic capacitor coupled between the inductor Lc3 of the intermediate tap inductor 1050 and the drain and source of the transistor M5 and the parasitic capacitor existing between the inductors Lc3 and Lc4 of the intermediate tap inductor 1050. This corresponds to the low frequency band of the dual-band system. The output signal of the low frequency band is outputted as a differential phase signal.

The second resonance is caused by the parasitic capacitor coupled between the inductor Lc3 of the intermediate tap inductor 1050 and the drain and source of the transistor M5. This corresponds to the high frequency band of the dual-band system, and the output signal of the high frequency band is outputted as a common phase signal.

Since the resonance frequency is decided by the parasitic capacitors of the intermediate tap inductor 1050, the dual bands exhibit a narrow-band gain characteristic.

In this embodiment of the present invention, the differential phase signal and the common phase signal which are converted by the intermediate tap inductor 1050 are applied to the two-stage cascode amplifiers 1010 and 1040, in order to improve the narrow-band gain characteristic.

In this embodiment of the present invention, the second amplifier stage has been proposed in such a manner as to output a signal having a differential phase as a differential phase signal and to output a signal having a common phase as a common phase signal.

Then, the signal of the low frequency band is finally outputted as a differential phase signal and the signal of the high frequency band is finally outputted as a common phase signal through the intermediate tap inductor 1020. However, the value of the intermediate tap inductor 1020 is set differently from the value of the intermediate tap inductor 1050 of the first stage, in order to implement the resonance frequency in a slightly different manner. Through this configuration, the respective bands of the dual bands may be implemented with a wideband instead of a narrowband.

Figure 11:
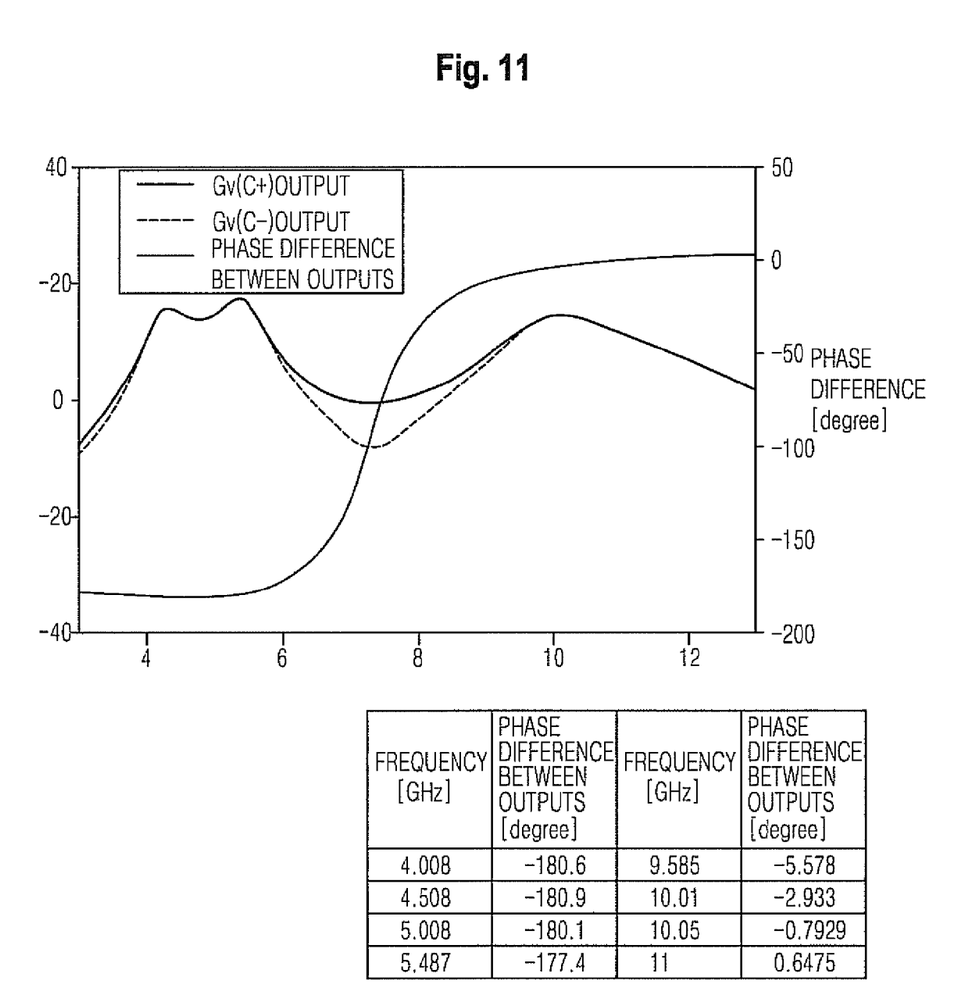
FIG. 11 is a graph showing gain characteristics and phase difference characteristics for the circuit diagram of FIG. 10.

FIG. 11 is a graph showing gain characteristics and phase difference characteristics for the circuit diagram of FIG. 10.

Referring to FIG. 11, the gain characteristic of the high frequency band between the dual bands is not sensitively changed at a resonance point according to an inductance value, unlike the gain characteristic of the low frequency band. Since a capacitance value multiplied by the inductance value of Equation 2 at the low frequency is considerably larger than a capacitance value multiplied by the same inductance value of Equation 4 at the high frequency, the change in the low frequency of Equation 2 depending on the change of the inductance value is more sensitive than the change in the high frequency of Equation 4.

Meanwhile, both output terminals of the LNA exhibit a phase difference of 180 degrees at the low frequency and a phase difference of 0 or 360 degrees at the high frequency.

Figure 12:
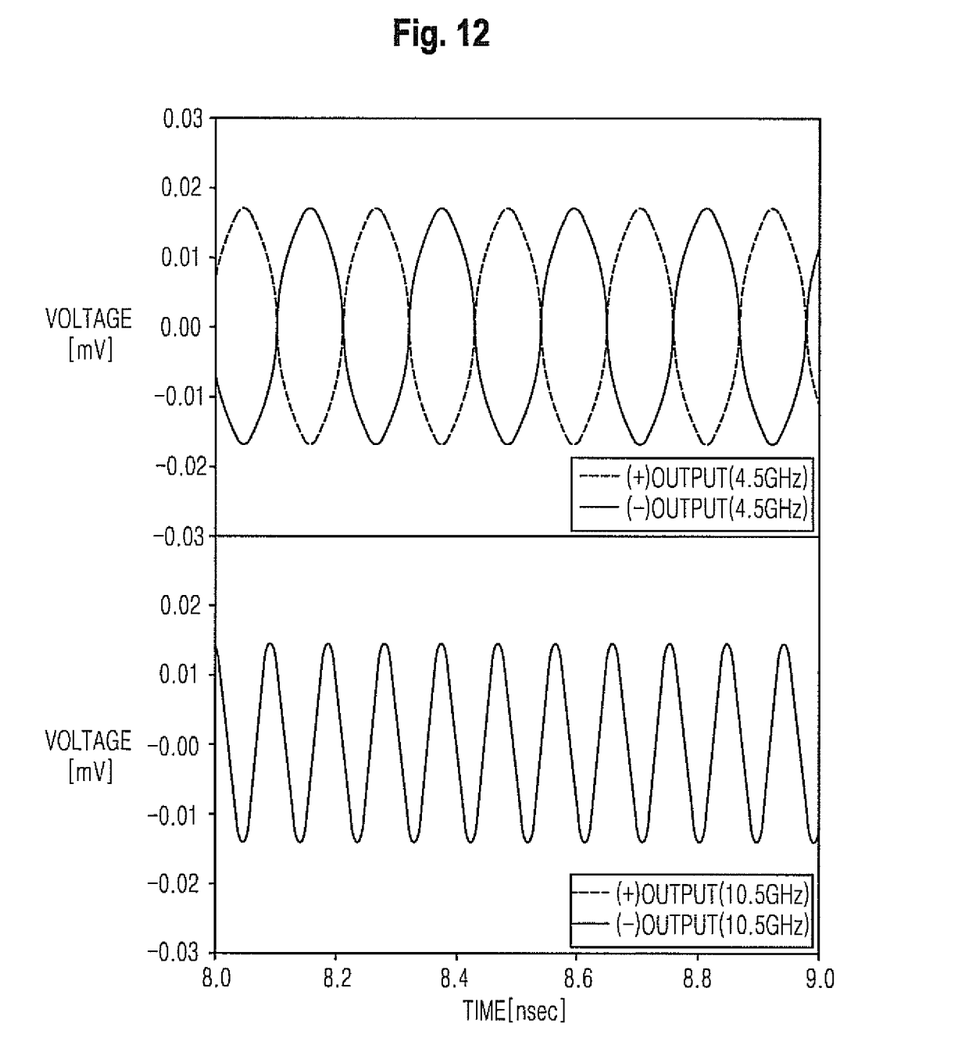
FIG. 12 is a graph showing a transient simulation result of dual-band output signals in the circuit diagram of FIG. 10.

FIG. 12 is a graph showing a transient simulation result of the dual-band output signals in the circuit diagram of FIG. 10.

Referring to FIG. 12, it can be seen that a differential phase signal is outputted at a frequency of 4.5 GHz corresponding to the low frequency band, and a common phase signal is outputted at a frequency of 10.5 GHz corresponding to the high frequency band.

According to the embodiments of the present invention, in the wireless communication system receiving single-phase signals, two different wideband signals having a bandwidth of 1 GHz or more may be received, and reflection and noise figures of the received signals may be minimized to secure isolation between input and output. Then, the signals of the respective bands may be amplified.

Furthermore, when two different single-phase signals are processed, a low-frequency band signal is outputted as an accurate differential phase signal, and a high-frequency band signal is outputted as an accurate common phase signal. The respective frequency band signals outputted in such a manner may be transmitted to the next stage without interference with each other.

Furthermore, the dual-band receiving apparatus according to the embodiment of the present invention commonly uses the circuit used as the load unit of the LNA. Therefore, since the receiving apparatus does not require an additional amplification stage for acquiring dual bands, the receiving apparatus may have low power consumption and may be implemented with a small area.

Furthermore, the frequency down-converter including the differentiator and the combiner may process the dual-band signals transmitted from the LNA. Therefore, the receiving apparatus may have low power consumption and may be implemented with a small area.

The receiving apparatus according to the embodiment of the present invention may be applied to both of a direct-conversion receiving apparatus and a heterodyne-architecture receiving apparatus.

While the present invention has been described with respect to the specific embodiments, it will be apparent to those skilled in the art that various changes and modifications may be made without departing from the spirit and scope of the invention as defined in the following claims.

What is claimed is:

1. A receiving apparatus in a wireless communication system, comprising:
    an antenna configured to receive a wireless frequency signal comprising a first frequency band signal and a second frequency band signal;
    a low noise amplifier (LNA) configured to amplify the wireless frequency signal, output the first frequency band signal as a differential phase signal, and output the second frequency band signal as a common phase signal;
    a differentiator configured to pass only the differential phase signal between the signals outputted from the LNA; and
    a combiner configured to pass only the common phase signal between the signals outputted from the LNA.

2. The receiving apparatus according to claim 1, wherein the first frequency band comprises a lower frequency band than the second frequency band.

3. The receiving apparatus according to claim 1, wherein the differentiator is implemented as a first output terminal of a down-converter, and the combiner is implemented as a second output terminal of the down-converter.

4. The receiving apparatus according to claim 1, wherein the LNA comprises:
    a transconductance unit configured to perform wideband matching; and
    a load unit configured to output the differential phase signal and the common phase signal.

5. The receiving apparatus according to claim 4, wherein the load unit comprises a first capacitor, a second capacitor, a third capacitor, a first inductor, and a second inductor,
    wherein the third capacitor is coupled between a first node and a second node,
    wherein one ends of the first inductor and the first capacitor are coupled between the first node and the third capacitor,
    wherein the second inductor and the second capacitor are coupled between the second node and the third capacitor, and
    wherein the other ends of the first inductor, the first capacitor, the second inductor, and the second capacitor are coupled to a ground terminal.

6. The receiving apparatus according to claim 5, wherein the load unit further comprises a varactor, and the varactor is coupled in parallel to the third capacitor.

7. The receiving apparatus according to claim 6, wherein the varactor is configured to adjust a gain of the first frequency band.

8. The receiving apparatus according to claim 5, wherein the load unit further comprises a first varactor and a second varactor,
    wherein the first varactor is coupled in parallel to the first capacitor, and
    wherein the second varactor is coupled in parallel to the second capacitor.

9. The receiving apparatus according to claim 8, wherein the first varactor and the second varactor are configured to adjust the gain of the first frequency band and a gain of the second frequency band, respectively.

10. The receiving apparatus according to claim 1, wherein the receiving apparatus removes interference between the first frequency band and the second frequency band using a phase difference between the first frequency band and the second frequency band.

* * * * *